(12) United States Patent
Kapusta et al.

(10) Patent No.: US 10,957,832 B2
(45) Date of Patent: Mar. 23, 2021

(54) ELECTRONICS PACKAGE FOR LIGHT EMITTING SEMICONDUCTOR DEVICES AND METHOD OF MANUFACTURING THEREOF

(71) Applicant: General Electric Company, Schenectady, NY (US)

(72) Inventors: Christopher James Kapusta, Delanson, NY (US); Risto Ilkka Sakari Tuominen, Tokyo (JP); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/166,313

(22) Filed: Oct. 22, 2018

(65) Prior Publication Data
US 2020/0127178 A1     Apr. 23, 2020

(51) Int. Cl.
*H01L 33/62*     (2010.01)
*H01L 23/538*    (2006.01)
(Continued)

(52) U.S. Cl.
CPC .......... *H01L 33/62* (2013.01); *H01L 23/5384* (2013.01); *H01L 23/5386* (2013.01);
(Continued)

(58) Field of Classification Search
CPC ............. H01L 23/5384; H01L 23/5386; H01L 23/5387; H01L 25/0753; H01L 25/167;
(Continued)

(56) References Cited

U.S. PATENT DOCUMENTS 4,809,135 A * 2/1989 Yerman ............. H01L 21/67144
                                                174/536
6,184,544 B1 * 2/2001 Toda ................... H01L 33/486
                                                257/100
(Continued)

OTHER PUBLICATIONS

Huang et al., "Heat Dissipation for LED Lighting: Vapor Chamber Substrate Printed Circuit Board," 2010 5th IEEE Conference on Industrial Electronics and Applicationsis, Taichung, Taiwan, Jun. 15-17, 2010, pp. 565-570.
(Continued)

*Primary Examiner* — Allan R Wilson
(74) *Attorney, Agent, or Firm* — Ziolkowski Patent Solutions Group, SC

(57) ABSTRACT

A light emitting semiconductor (LES) device having desirable thermal performance characteristics is disclosed. The LES device includes an insulating substrate layer having a plurality of vias formed therein and at least one LES chip mounted on the insulating substrate layer, with each of the LES chips(s) including an active surface including a light emitting area configured to emit light therefrom and a back surface positioned on a top surface of the insulating substrate layer and including connection pads thereon. A conductor layer is positioned on a bottom surface of the insulating substrate layer and in the vias, the conductor layer in direct contact with the connection pads of the LES chip(s) so as to be electrically and thermally connected thereto. An encapsulant is positioned adjacent the top surface of the insulating substrate layer and surrounding at least part of the LES chip(s), the encapsulant comprising a light transmitting material.

25 Claims, 6 Drawing Sheets

(51) Int. Cl.
*H01L 33/54* (2010.01)
*H01L 33/60* (2010.01)
*H01L 25/075* (2006.01)
*H01L 25/16* (2006.01)
*H01L 33/64* (2010.01)

(52) U.S. Cl.
CPC ...... *H01L 23/5387* (2013.01); *H01L 25/0753* (2013.01); *H01L 25/167* (2013.01); *H01L 33/54* (2013.01); *H01L 33/60* (2013.01); *H01L 33/648* (2013.01); *H01L 2933/005* (2013.01); *H01L 2933/0058* (2013.01); *H01L 2933/0066* (2013.01)

(58) Field of Classification Search
CPC ......... H01L 33/54; H01L 33/60; H01L 33/62; H01L 33/648
See application file for complete search history.

(56) References Cited

U.S. PATENT DOCUMENTS

| | | | |
|---|---|---|---|
| 6,232,659 B1 | 5/2001 | Clayton | |
| 7,922,360 B2 | 4/2011 | Villard et al. | |
| 8,207,554 B2 | 6/2012 | Shum | |
| 8,686,445 B1* | 4/2014 | Hussell | H01L 33/486 257/88 |
| 8,987,876 B2 | 3/2015 | Gowda et al. | |
| 9,171,785 B2 | 10/2015 | Gowda et al. | |
| 9,613,843 B2 | 4/2017 | Gowda et al. | |
| 9,806,051 B2 | 10/2017 | Gowda et al. | |
| 2004/0212030 A1* | 10/2004 | Asai | G02B 6/12002 257/432 |
| 2005/0116235 A1* | 6/2005 | Schultz | H01L 24/48 257/79 |
| 2007/0176193 A1* | 8/2007 | Nagai | H01L 33/505 257/98 |
| 2010/0127284 A1* | 5/2010 | Nagai | H01L 25/0753 257/91 |
| 2012/0248481 A1* | 10/2012 | Seo | H01L 33/486 257/98 |
| 2014/0110728 A1* | 4/2014 | Lee | H01L 24/16 257/88 |
| 2019/0189875 A1* | 6/2019 | Lin | H01L 33/62 |

OTHER PUBLICATIONS

Schatzel et al., "Improving Heat Transfer Performance of Printed Circuit Boards," 2009 IEEE Aerospace Conference, Big Sky, MT, USA, Mar. 7-14, 2009, pp. 1-6.

* cited by examiner

ELECTRONICS PACKAGE FOR LIGHT EMITTING SEMICONDUCTOR DEVICES AND METHOD OF MANUFACTURING THEREOF

BACKGROUND OF THE INVENTION

Embodiments of the invention relate generally to structures and methods for packaging light emitting semiconductor devices and, more particularly, to electronics packaging that utilizes direct chip metallization to a light emitting semiconductor device, so as to provide for excellent heat transfer from the light emitting semiconductor device with reduced cost and complexity as compared to existing packaging substrates.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. One such device is a light emitting semiconductor device, with a prominent example being a light emitting diode (LED). LEDs are semiconductor chips that are packaged to emit radiation in response to an applied voltage or current. These LEDs are used in a number of commercial applications such as automotive, display, safety/emergency, and directed area lighting. LEDs may be fabricated using any materials which emit visible, ultra-violet, or infrared radiation.

As is known in the art, there are various technologies used to assemble and package LEDs for inclusion in a lighting structure. As one example of such LED packaging, LEDs are assembled onto insulated metal substrates (IMS), such as a metal core printed circuit board (MCPCB) or other ceramic-based substrate, for example. The MCPCB includes a metal baseplate (e.g., aluminum baseplate) covered by a thin layer of dielectric material (e.g., an epoxy-based layer) and a layer of copper, with the baseplate then being attached to a heatsink to provide cooling. One face of the LED chip/die is then typically soldered or silver adhesive attached to the copper and the other terminal/face wirebonded to the MCPCB. Alternatively, the LED chip can be packaged in a first level package which can then be soldered to the MCPCB. In this first level package, one face of the LED chip is soldered or silver die attached to a pad on a substrate (metalized ceramic or polymer) and the other terminal/face is attached via wirebond to another pad on the same substrate. As another alternative, the LED chip can be connected to the MCPCB via a flip-chip type attachment.

It is recognized, however, that there are several drawbacks to the existing method of packaging LED chips on a MCPCB and of the wirebonding/flip-chip attachment of the LED chip to the MCPCB. As a primary example, thermal management of the LED chip is challenging for high power applications (i.e., LEDs operated at 5-10 W or higher) when employing traditional packaging of the LED chip on a MCPCB. That is, it is recognized that the layer of dielectric material in the MCPCB (between the metal baseplate and the LED chip) can add unnecessary thermal resistance that may make it difficult to control LED chip-to-board junction temperatures, with these temperature control issues negatively impacting performance and/or efficiency of the LED chip, along with the reliability and "stability" of the LED, i.e., ability to control the intensity and/or wavelength of light emitted by the LED. Failure to control the LED chip-to-board junction temperatures can also lead to a junction temperature above an allowable threshold, which may damage the LED chip and/or lead to interfacial stress and cracks in the MCPCB due to coefficient of thermal expansion (CTE) mismatch between the chip and board. Additional drawbacks of packaging LED chips on a MCPCB include the increased cost and size/thickness of the MCPCB, as well as limitations regarding packing density and integration of the driver and control circuitry with the LED chip and MCPCB package.

Accordingly, it is desirable to provide a light emitting semiconductor device package that is freed from the constraints and drawbacks associated with mounting on a standard MCPCB. The light emitting semiconductor device package would provide improved thermal performance as compared to a standard MCPCB, while doing so in via a compact, low cost package that enables increased packing density and integration of driver and control circuitry.

BRIEF DESCRIPTION OF THE INVENTION

Embodiments of the invention overcome the aforementioned drawbacks by providing a packaging structure for use with light emitting semiconductor (LES) chips, where the packaging structure makes direct electrical and thermal connections to the LES chip(s). Vias are metalized to input/output (I/O) pads on the LES chip to provide electrical and thermal pathways thereto, with the conductive vias providing improved heat transfer out from the LED chip.

In accordance with one aspect of the invention, a light emitting semiconductor (LES) device includes an insulating substrate layer comprising a top surface and a bottom surface and a plurality of vias formed therein and at least one LES chip mounted on the top surface of the insulating substrate layer, each of the at least one LES chips including an active surface including a light emitting area configured to emit light therefrom responsive to a received electrical power and a back surface positioned on the top surface of the insulating substrate layer and including connection pads thereon. The LES device also includes a conductor layer positioned on the bottom surface of the insulating substrate layer and in the plurality of vias, the conductor layer in direct contact with the connection pads of the at least one LES chip so as to be electrically and thermally connected thereto. The LES device further includes an encapsulant positioned adjacent the top surface of the insulating substrate layer and surrounding at least part of the at least one LES chip, the encapsulant comprising a light transmitting material.

In accordance with another aspect of the invention, a method of forming a LES device includes providing a LES chip comprising an active surface having a light emitting area configured to emit light therefrom and a back surface having connection pads thereon, attaching the back surface of the LES chip to a first side of an insulating substrate layer, and forming a conductor layer on a second surface of the insulating substrate layer opposite the first surface, the conductor layer extending through vias in the insulating substrate layer to electrically couple with the connection pads of the LES chip. The method also includes positioning a conductor layer on the bottom surface of the insulating substrate layer and in the plurality of vias, the conductor layer directly coupled to the connection pads of the LES chip so as to be electrically and thermally connected thereto. The method further includes applying an encapsulant over the insulating substrate layer and about the LES chip to at least partially surround the LES chip via a panel process that maintains planarity of the LES device during encapsulation of the LED chip.

In accordance with yet another aspect of the invention, a LES device includes an insulating substrate layer comprising a top surface and a bottom surface and a plurality of vias formed therein and an array of LES components mounted on the top surface of the insulating substrate layer, wherein each LES component comprises an active surface including a light emitting area configured to emit light therefrom and a back surface including connection pads. The LES device also includes a conductor layer positioned on the bottom surface of the insulating substrate layer and in the plurality of vias to provide a direct electrical and thermal path to the array of LES components, the conductor layer comprising conductive vias formed in the plurality of vias and directly coupled to the connection pads of each of the LES components in the array of LES components and conductive plates coupled to the conductive vias and positioned on the bottom surface of the insulating substrate layer, the conductive plates providing anode and cathode connections to the LES device. The LES device further includes an encapsulant positioned adjacent the top surface of the insulating substrate layer and surrounding the array of LES components.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide a packaging structure for use with light emitting semiconductor chips such as LED chips, where the packaging structure makes direct electrical and thermal connections to the LED chip. Vias are metalized to input/output (I/O) pads on the LED chip to provide electrical and thermal pathways thereto, with the metalized vias providing improved heat transfer out from the LED chip.

Figure 1:
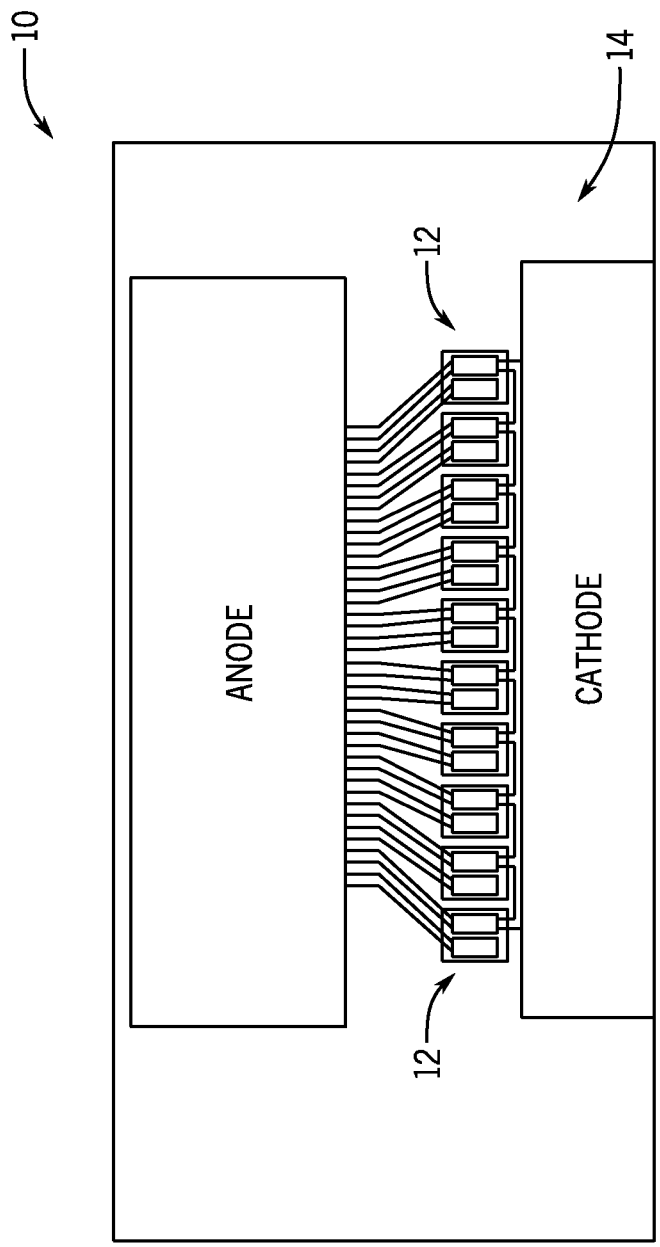
FIG. 1 is a schematic of a light emitting semiconductor (LES) device including an array of LED chips and an electronics package, according to an embodiment of the invention.

Referring to FIG. 1, a light emitting semiconductor (LES) device 10 is shown according to an embodiment of the invention. The LES device 10 includes one or more LES chips or components 12 arranged in a specified pattern and shape to provide a desired illumination coverage to be generated by LES device 10. According to an exemplary embodiment of the invention, the LES chip(s) 12 are in the form of light emitting diode (LED) chip(s), and are thus referred to hereafter as LED chip(s) 12, although it is recognized that the LES chip(s) 12 could also be in the form of other suitable non-diode type light emitting semiconductor chip(s). The LED chip(s) 12 are packaged in/on an electronics package 14 that provides for direct electrical and thermal connections to the LED chip(s) 12, so as to provide for improved heat transfer out from the LED chip(s) 12 and improved thermal management of the LES device. According to embodiment, the electronics package 14 may be configured to hold one LED chip 12 or any desired number of LED chips 12, with the LED chips 12 being arranged in any shape or array size. The electronics package 14 also provides for accurate alignment of the LED chips 12 and a tight/close arrangement thereof.

Figure 2:
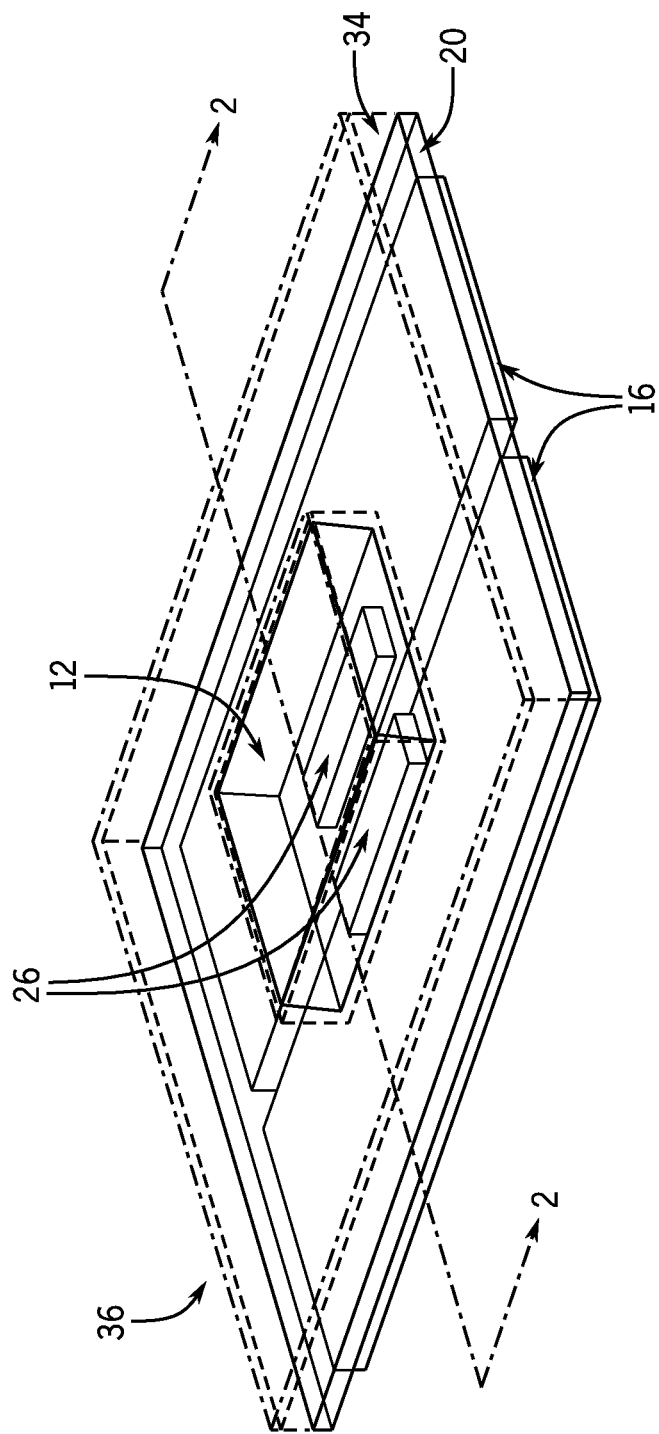
FIG. 2 is a perspective view of an LES illustrating packaging of a single LED chip, according to an embodiment of the invention.
Figure 3:
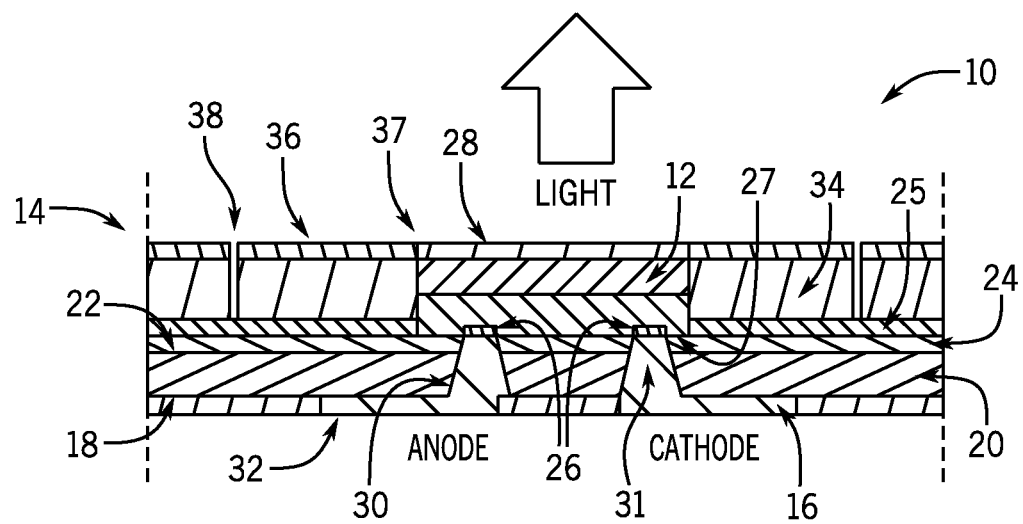
FIG. 3. is a cross-sectional view of the LES device of FIG. 2 taken along line 2-2, according to an embodiment of the invention.

Referring now to FIGS. 2 and 3, perspective and cross-sectional schematic views of a portion of LES device 10 are shown to illustrate a single LED chip 12 and electronics package 14 for accommodating LED chip 12, according to an embodiment of the invention, with the single LED chip 12 being shown for purposes of simplification. The electronics package 14 includes a conductor layer 16 or metallization layer formed on a bottom surface 18 of an insulating substrate 20.

According to various embodiments, insulating substrate 20 may be provided in the form of an insulating film or dielectric substrate, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples. In one embodiment, a layer of component attach material 24 is used to affix LED chip 12 to a top surface 22 of insulating substrate 20. According to various embodiments, component attach material 24 is an electrically insulating material that is applied to surrounding components of the electronics package by, for example, spin coating, spray coating, or meniscus coating. Component attach material 24 may be a polymeric material (e.g., epoxy, silicone, liquid crystal polymer, or a ceramic, silica, or metal filled polymer) or other organic material as non-limiting examples. According to embodiments, component attach material 24 may be provided on top surface 22 of insulating substrate 20 in either an uncured or partial cured (i.e., B-stage) form, or component attach material 24 may be applied to the LED chip 12 prior to coupling component attach material 24 to top surface 22 of insulating substrate 20.

According to one embodiment, and as shown in phantom in FIG. 3, a protective film or deposited layer 25 may be applied on top of component attach material 24. The protective film or layer 25 blocks UV radiation from affecting the component attach material 24 and insulating substrate 20. According to embodiments, the protective film or layer 25 may be in the form of a metal deposited film (e.g., Al) or other UV blocking material.

In alternative embodiments, LED chip 12 may be affixed to insulating substrate 20 by way of an adhesive property of the insulating substrate 20 itself. In such an embodiment, component attach material 24 is omitted and insulating substrate 20 is provided in the form of a single dielectric layer having adhesive properties. Non-limiting examples of such an adhesive dielectric layer include a spin-on dielectric such as polyimide or polybenzoxzaole (PBO).

As shown, LED chip 12 is positioned such that a back surface 27 thereof comprising electrical contact pads or connection pads 26 is positioned into component attach material 24 and such that an active surface or area 28 (i.e., light emitting surface/area) of the LED chip 12 is left exposed. Contact pads 26 provide conductive routes (I/O connections) to internal contacts within LED chip 12. Contact pads 26 may have a composition that includes a variety of electrically conductive materials such as aluminum, copper, gold, silver, nickel, or combinations thereof as non-limiting examples.

Conductor layer 16 is an electrically conductive material that creates a series of electrical connections to the contact pads 26 of LED chip 12. That is, conductor layer 16 extends through a series of vias 30 formed through a thickness of insulating substrate 20 (and also adhesive layer 24)—thereby forming conductive vias 31 that are directly coupled/connected to contact pads 26 on LED chip 12. The conductive vias are joined to large area conductive pads or plates 32 that are formed on bottom surface 18 of the insulating substrate 20.

According to one embodiment, conductor layer 16 (i.e., conductive vias 31 and conductive pads/plates 32) are formed solely of copper. However, other electrically conducting materials or a combination of metal and a filling agent may be used in other embodiments. That is, the conductor layer 16 may be composed of a barrier or adhesion layer, a seed layer, and a relatively thick layer of bulk material that is plated atop the seed and barrier layers achieving the desired conductive layer thickness. In alternative embodiments, the barrier layer and/or the seed layer may be omitted from the wiring layers. The barrier layer, when used, is applied to the insulating substrate 20 prior to application of the seed layer and bulk material. The barrier layer may include titanium or chromium, as non-limiting examples. When used, seed metal layer may be an electrically conductive material such as copper, as one non-limiting example. The layer of bulk material is plated up to achieve the desired thickness of the conductor layer 16, with the bulk material portion of each wiring layer including at least one electrically conductive material such as copper, aluminum, gold, silver, nickel, other standard wiring material, or combinations thereof as nonlimiting examples. However, other electrically conducting materials or a combination of metal and a filling agent may be used in other embodiments. In some embodiments the barrier layer may have a thickness in the approximate range of 0.1 to 0.4 microns, the seed metal layer may have a thickness in the approximate range of 1 to 3 microns and the bulk layer may have a thickness in the approximate range of 10 to 100 microns, with it being recognized that other materials at other thicknesses can be used based on design requirements. Alternatively, conductor layer 16 may be formed of an electrically conductive polymer or formed using inks that contain conductive metal particles.

According to an exemplary embodiment, conductor layer 16 is fabricated as a power overlay (POL) connection having a robust construction, such that the conductor layer 16 (i.e., conductive vias 31 and conductive pads/plates 32) may function as an efficient electrical and thermal connection to LED chip 12. That is, the conductive vias 31 and conductive pads/plates 32 are formed to a desired shape or thickness so as to provide for electrical and thermal connections to LED chip 12. According to one embodiment, the size and number of conductive vias 31 is controlled to maximize heat transfer out from the LED chip 12 and to the conductive pads or plates 32. For example, conductive vias 31 having a diameter of 30 micrometers or greater may be provided, with 1 to 100 conductive vias being formed to the LED chip 12 to remove heat therefrom, with it being understood that the size and number of vias is driven by the pad size of the LED chip. Additionally, the conductive pads or plates 32 in conductor layer 16 are constructed to provide a large area thermal and electrical connection on the bottom side of electronics package 14, with the plates having a thickness of 10 micrometers or greater (e.g., 100 micrometers), to provide for efficient heat removal out from LED chip 12. Heat removal from the LED chip 12 may be controlled based on the specific conductive pads 32 (i.e., which and how many) are connected for second level assembly. According to an embodiment, the conductor layer 16 can also serve as the cathode and anode of the LES device 10.

As further shown in FIGS. 2 and 3, an encapsulant 34 is applied about LED chip 12 to at least partially surround the LED chip 12. The encapsulant 34 may be in the form of silicone or another suitable light transmitting material that also acts to electrically insulate the LED chip 12. Additionally, one or more additives, such as phosphor, may be included in encapsulant 34 that interacts with light emitted by the LED chip 12 (e.g., blue or ultra-violet light) to give a full spectrum of visible light. The encapsulant 34 is applied to surround sides of the LED chip 12. In one embodiment, the encapsulant 34 may also be applied over the active surface 28 of LED chip 12 to protect the active area 28 thereof while permitting light to pass therethrough, or alternatively a window/opening may be left open over the active surface 28 of LED chip 12 and active area 28 thereof. In the embodiment where the encapsulant 34 is applied over the active surface 28 of LED chip 12, the encapsulant 34 is configured/applied such that total internal reflection (TIR) within the encapsulant 34 is avoided, with an angle of incidence being lower than a critical angle so as to avoid TIR and thereby minimize reflection at its interface with the surrounding medium (i.e., air). According to an exemplary embodiment, the encapsulant also acts as a stiffener or rigidizer to reduce warpage of the electronics package 14. In such an embodiment, the encapsulant can be applied on electronics package 14 while still on a frame/panel format, to help keep the structure flat, as will be explained in further detail below.

According to an exemplary embodiment, and as shown in FIG. 3, a reflective material 36 (i.e., "reflector") is applied onto/adjacent encapsulant 34. In the illustrated embodiment, the reflector 36 is provided as a film of aluminum or other suitable reflective material and is coated/positioned on an outer surface of a portion of encapsulant 34, so as to be adjacent the active surface 28 of the LED chip 12. The reflector 36 is configured so as to have a high spectral reflectance in a wavelength regime of interest, so as to maximize reflection and reduce optical losses in LES device 10, thereby improving optical performance of LES device 10. Additionally, the reflector 36 may further function to block UV radiation to protect component attach material 24 and insulating substrate 20, and may thus be used in lieu of (or in addition to) protective film or layer 25.

Figure 4:
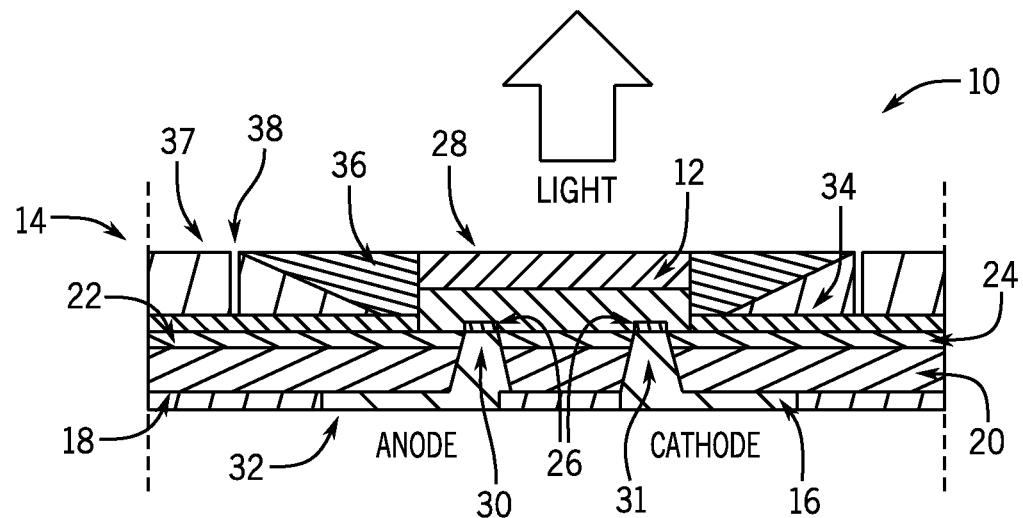
FIG. 4 is a cross-sectional view of an LES device, according to another embodiment of the invention.
Figure 5:
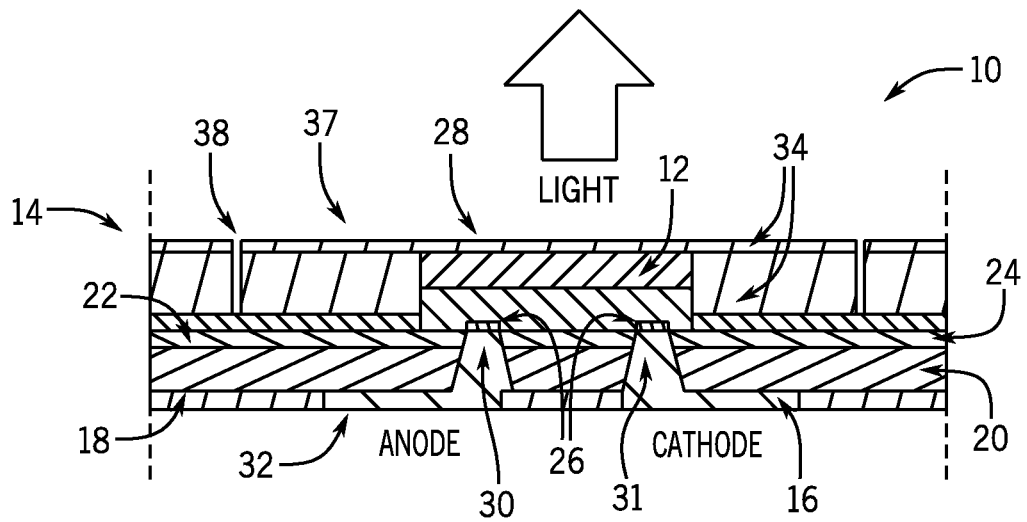
FIG. 5 is a cross-sectional view of an LES device, according to another embodiment of the invention.

In another embodiment of LES device 10, and as shown in FIG. 4, the reflector 36 may be structured as a cupped reflector 36 that is positioned over encapsulant 34. In such an embodiment, encapsulant 34 is applied such that it is structured/shaped to accommodate positioning of the cupped reflector 36 thereon, with the cupped reflector 36 positioned about LED chip 12. The encapsulant 34 could be applied/constructed via injection molding to provide this shape or could be a pre-fabricated component that is attached to the insulating substrate 20 using an adhesive (e.g., adhesive 24). In yet another embodiment of LES device 10, and as shown in FIG. 5, LES device 10 is constructed without a reflector 36. In such an embodiment, encapsulant 34 may be applied over the active surface 28 of LED chip 12.

Figure 6:
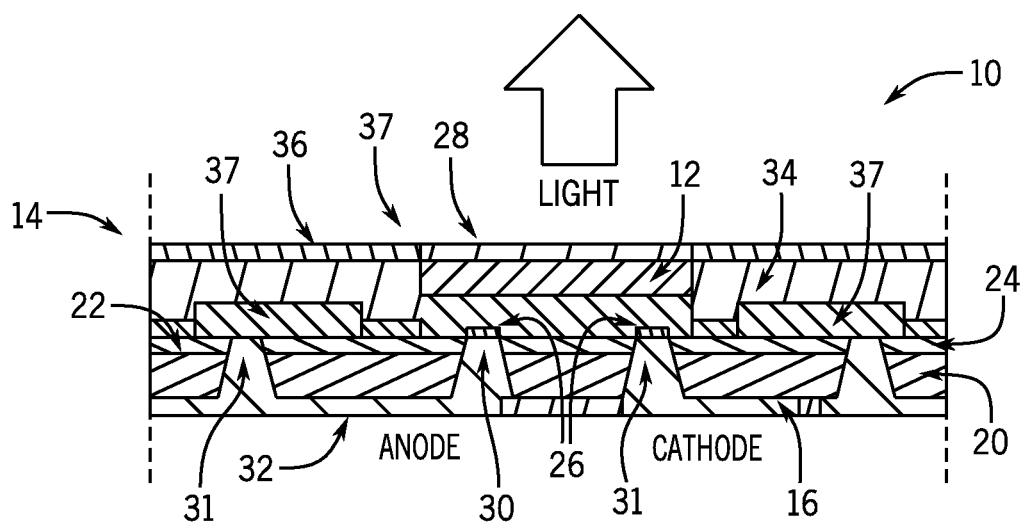
FIG. 6 is a cross-sectional view of an LES device, according to another embodiment of the invention.

While the LES device 10 is illustrated in FIGS. 3-5 as including only LED chip 12 in electronics package 14, it is recognized that LES device 10 could also include other electronic components such as a driver circuit, passive components (resistors, capacitors, etc.), and heat pipes, for example, with examples of such components generally indicated as elements 37 in FIG. 6. These additional components would be positioned on top surface 22 of insulating substrate 20 and, according to one embodiment, could be embedded within encapsulant 34 along with the LED chip 12.

According to an exemplary embodiment, the encapsulant 34 may be applied/formed by a panel process that is used to maintain planarity of the LES device during encapsulation of the LED chip 12. That is, as will be explained in further detail below with regard to the fabrication process of LES device 10, the LES device 10 (i.e., insulating substrate 20 thereof) is maintained on a frame during build-up of the LES device 10, and encapsulant 34 is applied onto insulating substrate 20 via a panel process while the insulating substrate is still mounted to the frame. Accordingly, the planarity of a light emitting surface 37 of the LES device 10 may be maintained at a desired level during fabrication thereof—with the light emitting surface 37 being a planar or nearly planar surface. As defined herein, the term "nearly planar" is understood to mean that the light emitting surface is within <500 micrometers of planarity. According to the embodiments illustrated in FIGS. 3-5, the light emitting surface 37 of LES device 10 may be formed by combinations of one or more of active surface 28 of LED chip 12, encapsulant 34, and/or reflector 36, with planarity being maintained via the controlled application of encapsulant 34 (and subsequent providing of reflector 36 thereon). According to other embodiments, the electronics package 14 could be constructed to have a controlled 3D shape, where the insulating substrate 20 is bent before application/molding of the encapsulant 34, so as to result in a 3D LES device 10 of a desired shape.

According to embodiments of the invention, the electronics package 14 may be constructed as a rigid structure, a flexible structure, or a "flex-rigid" structure where the area about LED chip(s) 12 is rigid/not bendable but the area outside the LED chip(s) would bend freely. That is, in an embodiment where LES device 10 is to be used as a directional light source, then electronics package 14 may be built as a rigid structure, with conductor layer 16, insulating substrate 20, and encapsulant 34 being structured to provide rigidity to the LES device 10. In an embodiment where LES device 10 is to be used in a product having a curved surface or shape, such as round lamp bulbs, flood lights, cylindrical flashlights, etc., then electronics package 14 may be built as a flexible structure or flex-rigid structure, with conductor layer 16, insulating substrate 20, and encapsulant 34 being structured to provide flexibility to the LES device 10. As examples of providing such flexibility, the insulating substrate 20 may be formed as a flexible film, and the encapsulant 34 may have a partitioned construction, with the encapsulant 34 around each LED chip 12 being partitioned/sectioned from the encapsulant 34 around adjacent LED chips 12 by way on slits 38 formed in the encapsulant 34 that provide flexibility between adjacent encapsulate sections, with it being recognized that the insulating substrate 20 could extend outside the region of encapsulant 34, based on the planned use of the LES device 10. These flexible features in electronics package 14 allow the electronics package to generally conform to a shape/pattern of the device or component in which LES device 10 is incorporated.

Referring now to FIGS. 7-12, an exemplary technique for manufacturing the LES device 10 of FIGS. 2 and 3 is set forth. A cross-section of the build-up process for a single LES device 10 (packaging a single LED chip 12) is shown in each of FIGS. 7-12 for ease of visualization of the build-up process. However, one skilled in the art will recognize that multiple LED chips could be included/packaged in an LES devices 10, with such packaging being done in a similar manner.

Figure 7:
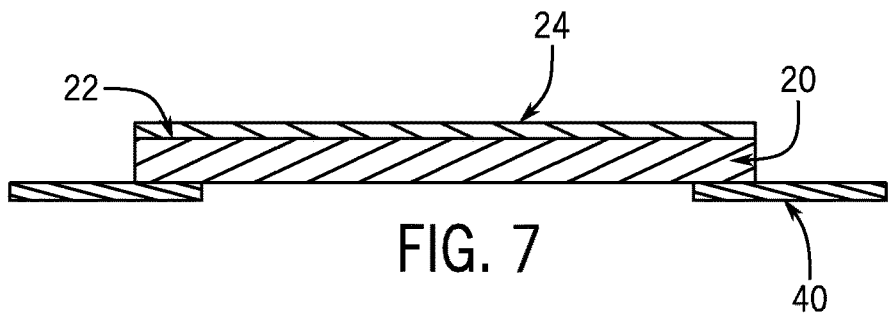
FIGS. 7-12 are schematic cross-sectional views of an LED chip and electronics package illustrating a build-up of the electronics package, according to an embodiment of the invention.

Referring first to FIG. 7, fabrication of LES device 10 begins by securing insulating substrate 20 on a perimeter frame 40 that provides support during build-up of the electronics package 14, with it being recognized that the frame 40 could hold arrays of multiple LES devices for batch processing. Upon securing of the insulating substrate 20 on perimeter frame 40, a component attach material 24 is applied to a top surface 22 of insulating substrate 20. In the illustrated embodiment, component attach material 24 is applied such that it coats the entirety of the top surface 22. In alternative embodiments, component attach material 24 may be applied to coat only select portions of the top surface 22 of insulating substrate 20. Component attach material 24 may be applied using a coating technique such as spin coating or slot die coating, using a lamination or spray process, or may be applied by a programmable dispensing tool in the form of an inkjet printing-type device technique, as non-limiting examples.

Figure 8:
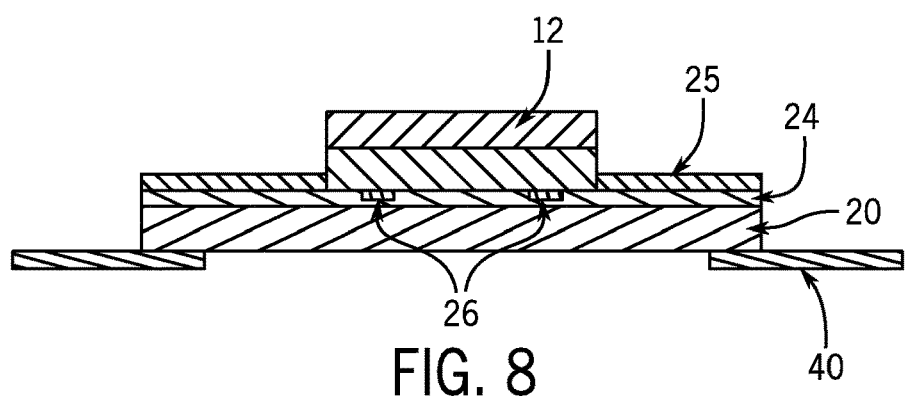

The LED chip 12 is coupled to insulating substrate 20 by positioning the back surface of the LED chip 12 on the component attach material 24 using conventional pick and place equipment and methods, as shown in FIG. 8. After LED chip 12 is positioned, component attach material 24 is fully cured, thermally or by way of a combination of heat or radiation. Suitable radiation may include UV light and/or microwaves. In one embodiment, a partial vacuum and/or above atmospheric pressure may be used to promote the removal of volatiles from the adhesive during cure if any are present. In one embodiment, a protective film or deposited layer 25 may then be applied on top of component attach material 24 that blocks UV radiation from effecting the component attach material 24 and insulating substrate 20.

Figure 9:
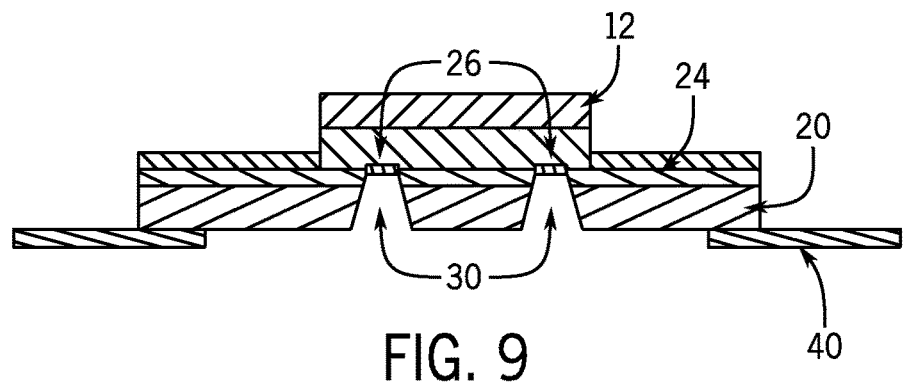

Referring now to FIG. 9 a plurality of vias 30 are formed through insulating substrate 20 and component attach material 24 to expose contact pads 26 of LED chip 12. Vias 30 may be formed by a UV laser drilling or dry etching, photo-definition, or mechanical drilling process as non-limiting examples. Alternately, vias 30 may be formed by way of other methods including: plasma etching, dry and wet etching, or other laser techniques like CO2 and excimer. In one embodiment, vias 30 are formed having angled side surfaces, as shown in FIG. 9, to facilitate later filling and metal deposition. While the formation of vias 30 through insulating substrate 20 and component attach material 24 is shown in FIG. 9 as being performed after placement of LED chip 12 into component attach material 24, it is recognized that the placement of LED chip 12 could occur after via formation. Furthermore, a combination of pre- and post-drilled vias could be employed.

Figure 10:
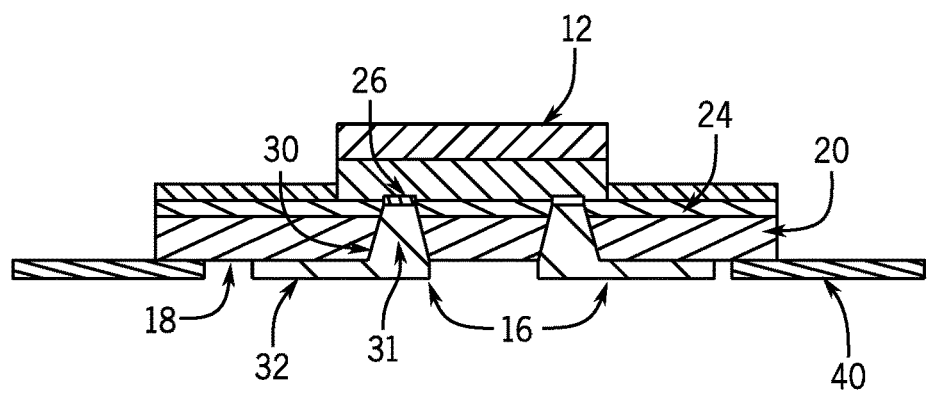

Upon securing LED chip 12 onto the insulating substrate 20 and following the formation of vias 30, the vias 30 are cleaned (such as through a reactive ion etching (ME) desoot process or laser process) and subsequently metalized to form conductor layer 16, as shown in FIG. 10. In one embodiment, a conductor layer 16 formed of copper, for example, is applied directly in vias 30 and to the bottom surface 18 of insulating substrate 20 using a sputtering and electroplating technique, although it is recognized that other electroless methods of metal deposition could also be used. Alternatively, a titanium adhesion layer and copper seed layer (not shown) may first be applied to insulating substrate 20 via a sputtering process, followed by an electroplating process that increases a thickness of the conductor layer 16 to a desired level.

Conductor layer 16 extends through vias 30 to form conductive vias 31 that electrically couple with contact pads 26 of LED chip 12, with conductor layer 16 being formed to a desired shape or thickness on bottom surface 18 to form conductive pads or plates 32 that provide for electrical and thermal connections to LED chip 12. According to one embodiment, the size and number of conductive vias 31 is controlled to maximize heat transfer out from the LED chip 12 and to the conductive pads or plates 32. For example, conductive vias 31 having a diameter of 30 micrometers or greater may be provided, with 1 to 100 conductive vias being formed to the LED chip 12 to remove heat therefrom. Additionally, conductive pads or plates 32 are constructed to provide a large area thermal and electrical connection on the bottom side of electronics package 10, with the pads/plates having a thickness of 10 micrometers or greater (e.g., 100 micrometers), for example, to provide for efficient heat removal out from LED chip 12. In forming conductor layer 16, a photoresist mask (not shown) may be formed on the conductor layer 16 and patterned with openings. With the first layer photoresist mask in place, the conductor layer 16 is subsequently patterned using an etching process to yield a patterned conductor layer 16 as shown in FIG. 8 that extends out from contact pads 26 of LED chip 12, through vias 30, and out across the bottom surface 18 of insulating substrate 20.

Figure 11:
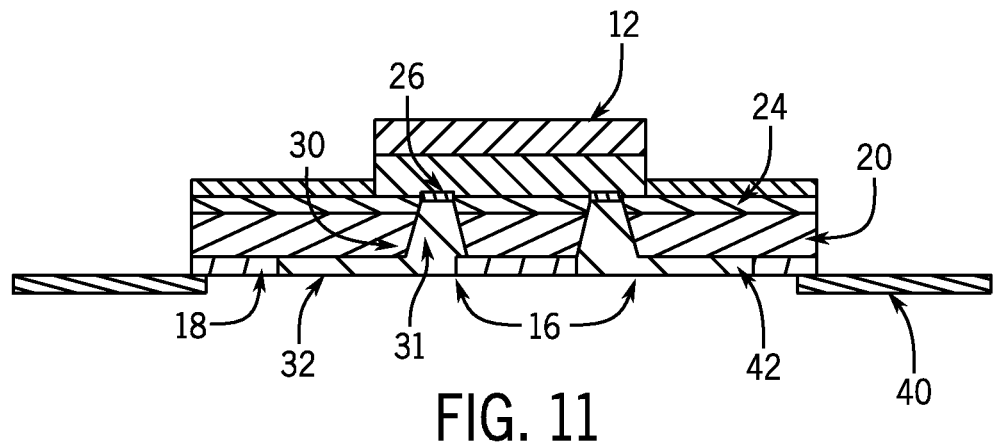

Referring now to FIG. 11, a solder mask layer 42 may be applied over the bottom surface 18 of insulating substrate 20 to provide a protective coating to electronics package 14 and define pads or plates 32 on the back/bottom side of the package for use in a second level assembly. Solder mask layer 42 may be applied over the bottom surface 18 of insulating substrate 20 not covered by conductor layer 16 and/or may partially cover conductor layer 16.

Figure 12:
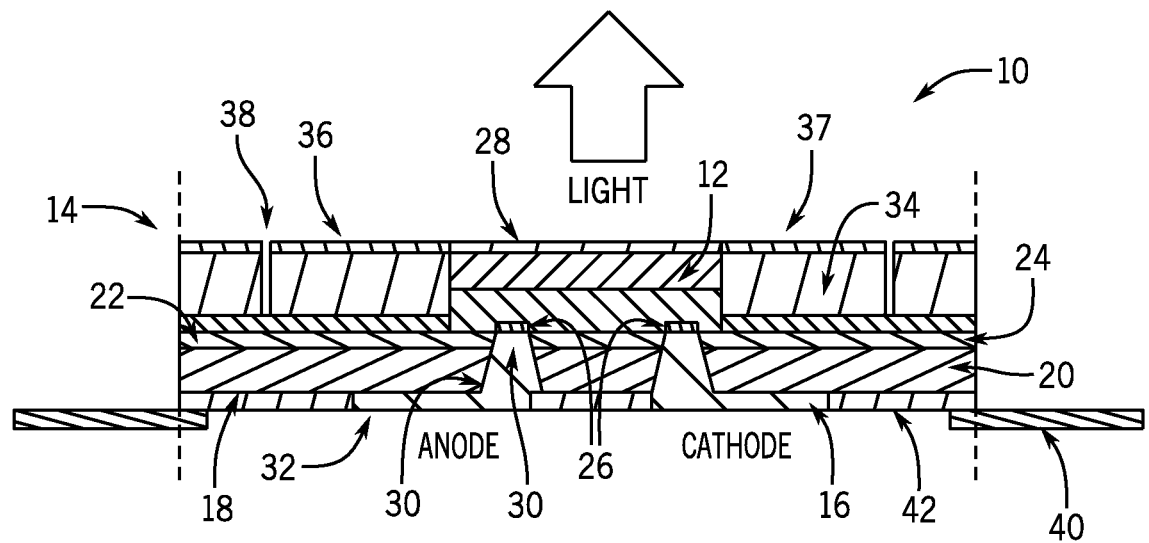

Referring now to FIG. 12, an encapsulant 34 and reflective material 36 is applied over insulating substrate 20 (and component attach material 24) to at least partially encapsulate/surround LED chip 12, so as to provide protection thereto. In an embodiment where multiple LED chips 12 are included in the LES device 10, the encapsulant 34 is accurately aligned to all LED chips 12 simultaneously. The encapsulant 34 can also act as a stiffener or rigidizer to reduce warpage of the electronics package 14. If this is the case, the encapsulant 34 can be applied while still on the frame 40, to help keep the LES device 10 flat.

The encapsulant 34 may be in the form of silicone another suitable light transmitting material and is applied to surround sides of the LED chip 12. The encapsulant 34 may also be applied over the active surface 28 of LED chip 12 to protect the active area 28 thereof while permitting light to pass therethrough, or alternatively a window/opening may be left open over the active surface 28 of LED chip 12 and active area thereof. In the embodiment of FIG. 12, reflective material 36 is provided as a film of aluminum or other suitable reflective material 36 and is coated on an outer surface of a portion of encapsulant 34. The coated film 34 is configured so as to have a high spectral reflectance in a wavelength regime of interest, so as to maximize reflection and reduce optical losses in LES device 10, thereby improving optical performance of LES device 10.

According to an exemplary embodiment, the encapsulant 34 may be applied/formed by a panel process that is used to maintain planarity of the LES device during encapsulation of the LED chip 12. As shown in FIG. 12, package structure 14 remains on the frame 40 when encapsulant 34 is applied onto insulating substrate 20, such that it is considered that encapsulant 34 is applied via a panel process. Accordingly, the planarity of light emitting surface 37 of the LES device 10 may be maintained at a desired level during fabrication thereof—with the light emitting surface 37 being a planar or nearly planar surface (i.e., flat or approximately flat within <500 micrometers of planarity).

Beneficially, embodiments of the invention provide a packaging structure for use with light emitting semiconductor chips such as LED chips, where the packaging structure makes direct electrical and thermal connections to the LED chip. These electrical and thermal pathways provided by the packaging structure enable efficient heat transfer out from the LED chip, with a thermal resistivity at a junction between the LED chip and the insulating substrate layer being between 0.5 and 1.0 C/W. A junction temperature between the LED chip and the insulating substrate layer 20 may thus be maintained between 85° C. and 95° C. during operation of the LES chip, according to an exemplary embodiment. The LED chip is thereby provided with improved thermal performance, low junction temperatures, and thus higher reliability (and improved/higher lumen output) as compared to a standard MCPCB to which LED chips are typically mounted. The LED chip packaging structure provides this improved thermal performance in a compact, low cost package that is freed from the constraints and drawbacks associated with mounting on a standard MCPCB. Additionally, the LED chip packaging structure may be configured as a flexible structure that provides for an arrangement of LED chips in various complex shapes, with the flexible interconnect structure conforming around complex shapes such as those typical in general incandescent lighting, for example, while still providing a robust interconnect to the LED chips.

Therefore, according to one embodiment of the invention, a light emitting semiconductor (LES) device includes an insulating substrate layer comprising a top surface and a bottom surface and a plurality of vias formed therein and at least one LES chip mounted on the top surface of the insulating substrate layer, each of the at least one LES chips including an active surface including a light emitting area configured to emit light therefrom responsive to a received electrical power and a back surface positioned on the top surface of the insulating substrate layer and including connection pads thereon. The LES device also includes a conductor layer positioned on the bottom surface of the insulating substrate layer and in the plurality of vias, the conductor layer in direct contact with the connection pads of the at least one LES chip so as to be electrically and thermally connected thereto. The LES device further includes an encapsulant positioned adjacent the top surface of the insulating substrate layer and surrounding at least part of the at least one LES chip, the encapsulant comprising a light transmitting material.

According to another embodiment of the invention, a method of forming a LES device includes providing a LES chip comprising an active surface having a light emitting area configured to emit light therefrom and a back surface having connection pads thereon, attaching the back surface of the LES chip to a first side of an insulating substrate layer, and forming a conductor layer on a second surface of the insulating substrate layer opposite the first surface, the conductor layer extending through vias in the insulating substrate layer to electrically couple with the connection pads of the LES chip. The method also includes positioning a conductor layer on the bottom surface of the insulating substrate layer and in the plurality of vias, the conductor layer directly coupled to the connection pads of the LES chip so as to be electrically and thermally connected thereto. The method further includes applying an encapsulant over the insulating substrate layer and about the LES chip to at least partially surround the LES chip via a panel process that maintains planarity of the LES device during encapsulation of the LED chip.

According to yet another embodiment of the invention, a LES device includes an insulating substrate layer comprising a top surface and a bottom surface and a plurality of vias formed therein and an array of LES components mounted on the top surface of the insulating substrate layer, wherein each LES component comprises an active surface including a light emitting area configured to emit light therefrom and a back surface including connection pads. The LES device also includes a conductor layer positioned on the bottom surface of the insulating substrate layer and in the plurality of vias to provide a direct electrical and thermal path to the array of LES components, the conductor layer comprising conductive vias formed in the plurality of vias and directly coupled to the connection pads of each of the LES components in the array of LES components and conductive plates coupled to the conductive vias and positioned on the bottom surface of the insulating substrate layer, the conductive plates providing anode and cathode connections to the LES device. The LES device further includes an encapsulant positioned adjacent the top surface of the insulating substrate layer and surrounding the array of LES components.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A light emitting semiconductor (LES) device comprising:
   an insulating substrate layer comprising a top surface and a bottom surface, the insulating substrate layer including a plurality of vias formed therein;
   at least one LES chip mounted on the top surface of the insulating substrate layer, each of the at least one LES chips comprising:
      an active surface including a light emitting area configured to emit light therefrom responsive to a received electrical power; and
      a back surface positioned on the top surface of the insulating substrate layer and including connection pads thereon;
   a conductor layer positioned on the bottom surface of the insulating substrate layer and in the plurality of vias, the conductor layer in direct contact with the connection pads of the at least one LES chip so as to be electrically and thermally connected thereto; and
   an encapsulant positioned adjacent the top surface of the insulating substrate layer and surrounding at least part of the at least one LES chip, the encapsulant comprising a light transmitting material.

2. The LES device of claim 1 wherein a light emitting surface of the LES device from which light is emitted by the at least one LES chip comprises a planar or nearly planar surface.

3. The LES device of claim 2 wherein the light emitting surface of the LES device is within <500 micrometers of planarity.

4. The LES device of claim 2 wherein the encapsulant is applied over the active surface of the at least one LES chip and forms the light emitting surface of the LES device.

5. The LES device of claim 2 wherein the encapsulant surrounds side surfaces of the at least one LES chip and forms a first portion of the light emitting surface; and
   wherein the active surface of the at least one LES chip is free of encapsulant and forms a second portion of the light emitting surface.

6. The LES device of claim 2 further comprising a reflector positioned on the encapsulant and adjacent the active surface of the LES chip to reduce optical losses in the LES device, such that the reflector and the active surface of the LES chip form the light emitting surface of the LES device.

7. The LES device of claim 1 further comprising:
   a component attach material positioned on the top surface of the insulating substrate layer and that adheres the at least one LES chip to the insulating substrate layer; and
   a protective layer positioned on the component attach material that provides UV protection to the component attach material and the insulating substrate layer.

8. The LES device of claim 1 wherein the conductor layer comprises:
   conductive vias formed in the plurality of vias and in direct contact with the connection pads of the at least one LES chip; and
   one or more plates in contact with the conductive vias and positioned on the bottom surface of the insulating substrate layer that provide thermal and electrical connections to the LES device.

9. The LES device of claim 8 wherein the conductive vias have a diameter of >30 micrometers and the one or more plates have a thickness of >10 micrometers.

10. The LES device of claim 8 wherein the one or more plates comprises a plurality of plates that function as a cathode and an anode for the LES device.

11. The LES device of claim 1 wherein a junction temperature between the LES chip and the insulating substrate layer is maintained between 85° C. and 95° C. during operation of the LES chip.

12. The LES device of claim 1 wherein thermal resistivity at a junction between the LES chip and the insulating substrate layer is between 0.5 and 1.0 C/W.

13. The LES device of claim 1 further comprising at least one additional LES chip mounted on the top surface of the insulating substrate layer, with the conductor layer positioned in additional vias formed in the insulating substrate layer, so as to be directly coupled to the connection pads of each of the at least one additional LES chips and electrically and thermally connected thereto.

14. The LES device of claim 13 wherein the insulating substrate layer comprises a flexible dielectric film and the encapsulant includes partitions therein between adjacent LES chips, such that the LES device is constructed as a flexible device.

15. The LES device of claim 1 further comprising one or more of a driver circuit, passive component, and heat pipe mounted on the top surface of the insulating substrate layer and surrounded by the encapsulant.

16. A method of forming a light emitting semiconductor (LES) device comprising:
providing a perimeter frame;
mounting an insulating substrate layer to the perimeter frame, the insulating substrate layer having a first side and a second side, with the second side attached to the perimeter frame;
providing a LES chip comprising an active surface having a light emitting area configured to emit light therefrom and a back surface having connection pads thereon;
attaching the back surface of the LES chip to the first side of the insulating substrate layer;
forming a conductor layer on a second surface of the insulating substrate layer opposite the first surface, the conductor layer extending through vias in the insulating substrate layer to electrically couple with the connection pads of the LES chip; and
applying an encapsulant over the insulating substrate layer and about the LES chip to at least partially surround the LES chip via a panel process that maintains planarity of the LES device during encapsulation of the LED chip;
wherein the insulating substrate layer remains mounted to the perimeter frame during application of the encapsulant to maintain planarity of the LES device.

17. The method of claim 16 wherein the insulating substrate layer is mounted to the perimeter frame prior to attachment of the LES chip to the insulating substrate layer, and wherein the perimeter frame is removed upon formation of the LES device.

18. The method of claim 16 wherein, in applying the encapsulant via the panel process, the encapsulant is applied within +/−500 micrometers of planarity.

19. The method of claim 16 wherein forming the conductor layer comprises:
forming a plurality of conductive vias in the vias in the insulating substrate layer, the conductive vias in direct contact with the connection pads of the LES chip; and
forming one or more plates on the second surface of the insulating substrate layer and in contact with the conductive vias that provide thermal and electrical connections to the LES device.

20. The method of claim 19 wherein the one or more plates have a thickness of 10 micrometers or more.

21. The method of claim 16 wherein mounting the LES chip on the top surface of the insulating substrate layer comprises one of:
attaching the LES chip to the top surface of the insulating substrate layer via a component attach material applied between the LES chip and the top surface of the insulating substrate layer; or
attaching the LES chip to the top surface of the insulating substrate layer via a self-adhering property of the insulating substrate layer.

22. The method of claim 16 further comprising positioning a reflector adjacent the encapsulant, the reflector comprising a flat reflector positioned on a top surface of the encapsulant or a cupped reflector.

23. The method of claim 16 further comprising attaching at least one additional LES chip on the first surface of the insulating substrate layer, with the conductor layer positioned in additional vias in the insulating substrate layer, so as to be directly coupled to the connection pads of each of the at least one additional LES chips and electrically and thermally connected thereto.

24. A light emitting semiconductor (LES) device comprising:
an insulating substrate layer comprising a top surface and a bottom surface, the insulating substrate layer including a plurality of vias formed therein;
an array of LES components mounted on the top surface of the insulating substrate layer, wherein each LES component comprises an active surface including a light emitting area configured to emit light therefrom and a back surface including connection pads;
a conductor layer positioned on the bottom surface of the insulating substrate layer and in the plurality of vias to provide a direct electrical and thermal path to the array of LES components, the conductor layer comprising:
conductive vias formed in the plurality of vias and directly coupled to the connection pads of each of the LES components in the array of LES components; and
conductive plates coupled to the conductive vias and positioned on the bottom surface of the insulating substrate layer, the conductive plates providing anode and cathode connections to the LES device; and
an encapsulant positioned adjacent the top surface of the insulating substrate layer and surrounding the array of LES components.

25. The LES device of claim 24 wherein a light emitting surface of the LES device from which light is emitted by the array of LES components comprises a planar or nearly planar surface.

* * * * *